(12) United States Patent
Althaus et al.

(10) Patent No.: US 7,138,661 B2
(45) Date of Patent: Nov. 21, 2006

(54) OPTOELECTRONIC COMPONENT AND OPTOELECTRONIC ARRANGEMENT WITH AN OPTOELECTRONIC COMPONENT

(75) Inventors: Hans-Ludwig Althaus, Lappersdorf (DE); Thomas Killer, Hohenschambach (DE); Martin Weigert, Hardt (DE)

(73) Assignee: Infineon Technologies AG, Munich (DE)

( * ) Notice: Subject to any disclaimer, the term of this patent is extended or adjusted under 35 U.S.C. 154(b) by 92 days.

(21) Appl. No.: 10/938,067

(22) Filed: Sep. 10, 2004

(65) Prior Publication Data

US 2005/0056851 A1 Mar. 17, 2005

(30) Foreign Application Priority Data

Sep. 11, 2003 (DE) ............... 103 42 263

(51) Int. Cl.
*H01L 27/15* (2006.01)
(52) U.S. Cl. ............ 257/81; 257/432
(58) Field of Classification Search ........ 257/81, 257/82, 432, 433, 666, 787
See application file for complete search history.

(56) References Cited

U.S. PATENT DOCUMENTS

| 6,989,554 B1 * | 1/2006 | Schrodinger .......... 257/79 |
| 2003/0138009 A1 | 7/2003 | Weigert et al. | |
| 2004/0021144 A1 | 2/2004 | Schrodinger | |
| 2005/0056851 A1* | 3/2005 | Althaus et al. ........... 257/81 |

FOREIGN PATENT DOCUMENTS

| DE | 41 06 721 A1 | 9/1992 |
| DE | 199 45 133 C2 | 4/2001 |
| DE | 102 01 102 A1 | 7/2003 |
| DE | 102 36 376 A1 | 2/2004 |
| WO | WO 83/00408 A1 | 2/1983 |
| WO | WO 01/97294 A2 | 12/2001 |

* cited by examiner

*Primary Examiner*—Mark V. Prenty
(74) *Attorney, Agent, or Firm*—Eschweiler & Associates, LLC

(57) ABSTRACT

An optoelectronic component with an optoelectronic transducer device and an electrical circuit electrically connected to the transducer device mounted on a carrier substrate which is optically transparent for specific wavelengths. The transducer device is arranged on the front side of the carrier substrate, and light coupling takes place through the back side. The electrical circuit is formed as a circuit integrated into the carrier substrate or is formed on the carrier substrate using hybrid technology, the terminal contacts of the circuit being arranged on the front side of the carrier substrate. An optoelectronic arrangement with an optoelectronic component includes an at least partly planar-formed mounting element, which is connected by its one side to an outer side of the component or is integrated in the latter and extends at least as far as an outer edge of the component, and includes a mechanical interface for the mechanical connection of the component.

22 Claims, 9 Drawing Sheets

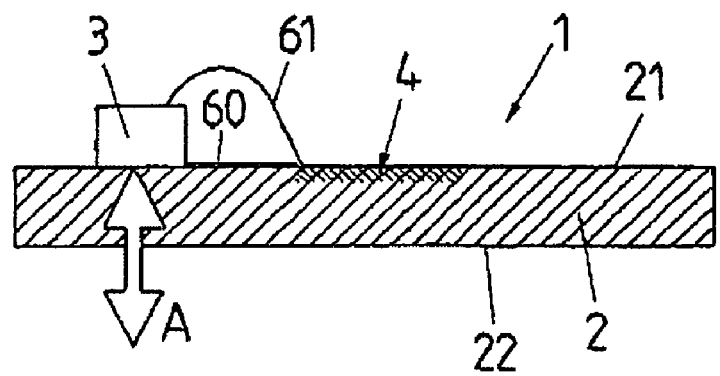
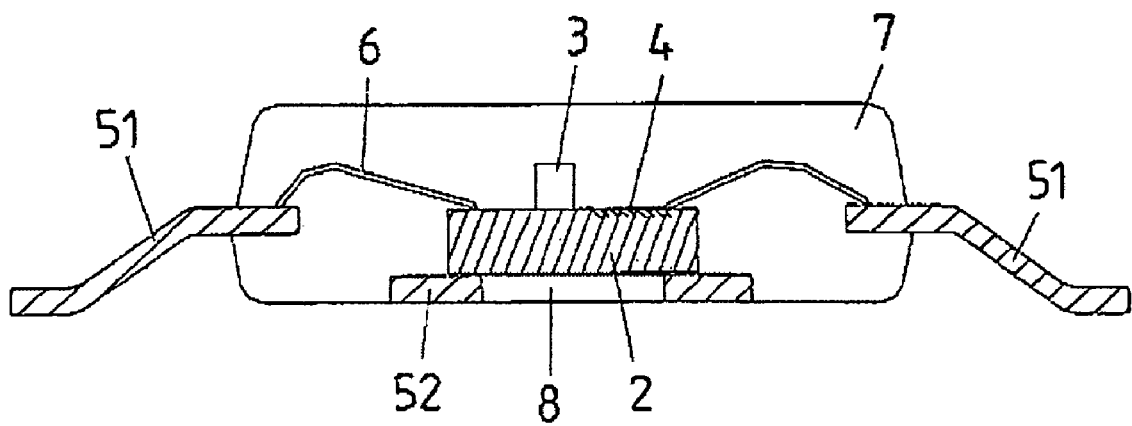

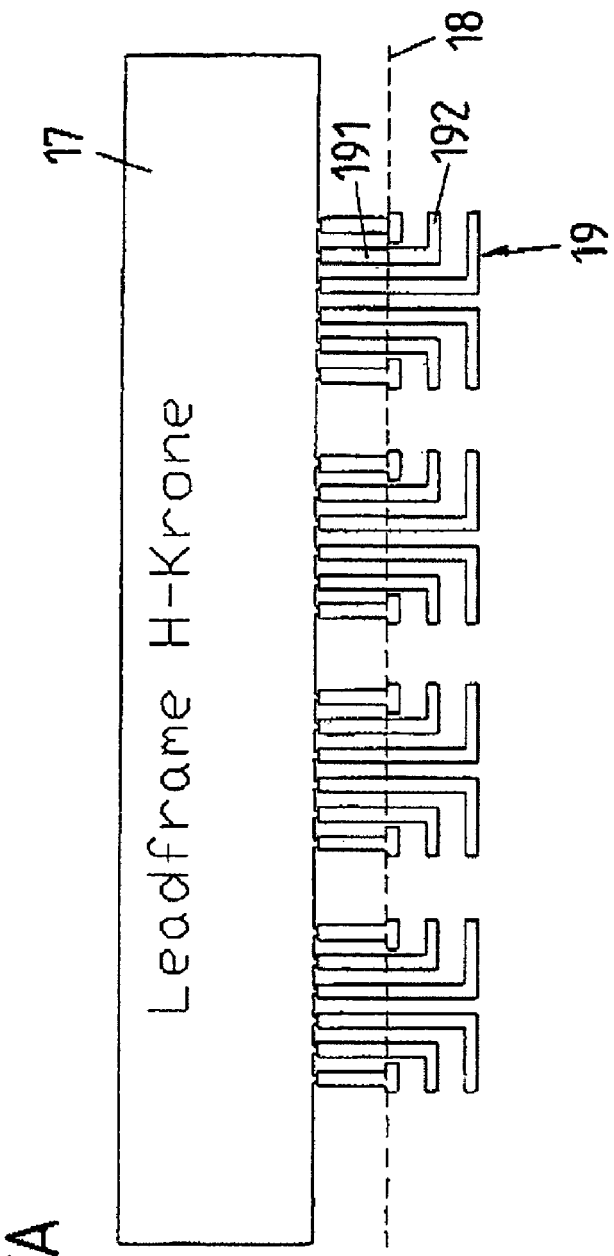
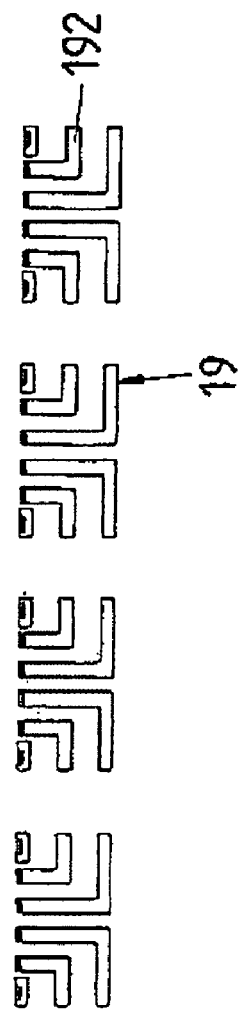
FIG 7A
FIG 7B

OPTOELECTRONIC COMPONENT AND OPTOELECTRONIC ARRANGEMENT WITH AN OPTOELECTRONIC COMPONENT

FIELD OF THE INVENTION

The invention relates to an optoelectronic component, and in particular to the construction of a surface-mountable optoelectronic component and its connection to further components.

BACKGROUND OF THE INVENTION

DE 102 01 102 A1 discloses an optoelectronic component in which a laser diode is arranged on an optically transparent carrier substrate, through which the light signal generated is emitted. The contacting of the laser diode and further components takes place by means of a leadframe. The arrangement is surrounded by a plastic package.

In the case of DE 41 06 721 A1, a number of photodiodes and associated amplifier devices are arranged on the surface of a carrier substrate. Relatively long signal paths between the photodiodes and the respectively associated amplifier devices are disadvantageously required, leading to an attenuation and interference of the detected signal, in particular at high frequencies in the GHz range.

SUMMARY OF THE INVENTION

The present invention is directed to an optoelectronic component which is distinguished by good signal properties and a compact construction. Furthermore, an arrangement which permits a mechanical connection of an optoelectronic component to a further component in a simple and reliable way is provided.

The component according to the invention is distinguished by the fact that the electrical circuit is formed as a circuit integrated into the carrier substrate or is formed on the carrier substrate using hybrid technology, the terminal contacts of the circuit for an electrical connection to the transducer device being arranged on the front side of the carrier substrate, on which the transducer device is arranged.

In this case, it may be provided that the back side of the carrier substrate is used for a GROUND connection of the electrical circuit.

The solution according to the invention is distinguished by the idea of providing an optoelectronic component in which an optoelectronic transducer device is arranged on an optically transparent carrier substrate, and in addition to an optical window for the light to be detected or for the light to be emitted also provides the electronic circuit for the optoelectronic component, by it being monolithically integrated or by using a hybrid technique. This dispenses with an electrical connection and allows the remaining connections to be made very short. In particular, there is no longer the need to provide additional metallizations and/or bonding wires to a separate wiring component. Rather, the electrical circuit is integrated directly into the carrier substrate, so that only one electrical connection is required between the component and the electrical circuit. In this way, higher data rates can be realized both in reception and in transmission.

The solution according to the invention is additionally very compact, since it manages with few components.

In a preferred refinement, the optoelectronic transducer device is directly connected to the associated terminal contacts of the electrical circuit by means of bonding wires and/or metallizations on the front side of the carrier substrate. In this case, it may be provided that the transducer device is mounted on the carrier substrate by flip-chip mounting. The contacts of the transducer device then preferably lie against the carrier substrate and contacting can take place by means of metallizations of the carrier substrate, without bonding wires being required.

In a preferred refinement, the component is an electronic chip on which the optoelectronic transducer device is mounted. The transducer device may in this case be mounted alongside the electrical circuit or else on or partly on the electrical circuit. All that is important is that the optical window region or the optically active region of the transducer device which serves for the detection or emission of light is not arranged on parts of the electrical circuit which would interfere with a detection or emission of light. By contrast, other regions of the transducer device may well also be arranged on the electrical circuit.

The production of the component preferably takes place from a wafer, using the following steps:

provision of a wafer of a material which is optically transparent for specific wavelengths, patterning of the wafer to create a multiplicity of chips, in each case with an electrical circuit and a non-patterned free region next to or in the circuit;

arrangement of an optoelectronic transducer device respectively on the free region of a chip, application of a transparent plastic between the transducer device and the chip, electrical connection respectively of the transducer device and the electrical circuit of the chip, and individual separation of the chips.

In this respect, the sequence of the individual steps can be varied. In particular, the individual separation may take place before or after attachment of the transducer device. The free region may be formed next to or else in the circuit, in the latter case the circuit having an "island" without patterning. The application of a transparent plastic or resin between the transducer device and the chip serves for index matching and for sealing, in particular to protect against non-transparent molding compound, with which the component may be encapsulated at a later point in time.

The optoelectronic arrangement according to the invention is distinguished by an at least partly planar-formed mounting element, which is connected by its one side to an outer side of the component or is integrated in the latter and extends at least as far as an outer edge of the component, and which provides with its other side a mechanical interface for the mechanical connection of the optoelectronic component to a further component. In this case, the mounting element is connected by its one side in particular to the plastic package of the component or the plastic package and an outer base plate of the component.

This provides a mechanical interface which is firmly connected to the component and by means of which a further component can be mechanically connected to the optoelectronic component in a simple way. The further component is, for example, a component receiving an optical waveguide, a light-guiding component or else merely a heat sink. The connection takes place with a flat surface of the component.

In a first refinement, the mounting element represents a part which is separate from the optoelectronic component and is joined to the plastic package of the component or to an outer base plate ("exposed die pad") integrated in the latter. In particular, the mounting element is a mounting plate which for instance consists of metal, a polymer or mixed materials, such as ceramic for example.

In a second refinement, by contrast, the mounting element is formed by an enlarged base plate ("exposed die pad") of the component. The base plate serves as a carrier of at least one component part of the optoelectronic component. It extends at least as far as an outer edge of the component. The base plate is preferably metallic and is preferably formed by the bottom region of a leadframe formed in a cup-shaped manner, i.e. the leadframe and the base plate (die pad) are punched or etched from one metal part. The base plate represents an outer side of the optoelectronic component.

The mounting element preferably serves additionally as a heat sink of the optoelectronic component. In particular when the mounting element is formed as a base plate (exposed die pad), a good heat sink is provided.

BRIEF DESCRIPTION OF THE DRAWINGS

The invention is explained in more detail below on the basis of a number of exemplary embodiments with reference to the figures, in which:

FIG. 1 schematically shows an optoelectronic component with a transducer device and an electrical circuit integrated in a carrier substrate;

FIG. 2 shows an actual exemplary embodiment of an optoelectronic component according to FIG. 1, the component being arranged in a plastic package and contacted by means of a leadframe;

FIG. 7A shows a leadframe for the contacting of the optoelectronic component of FIG. 6, FIG. 7B shows the leadframe of FIG. 7A after bending over of the contact leads by 90°;

DESCRIPTION OF A PREFERRED EXEMPLARY EMBODIMENT

Figure 3A:
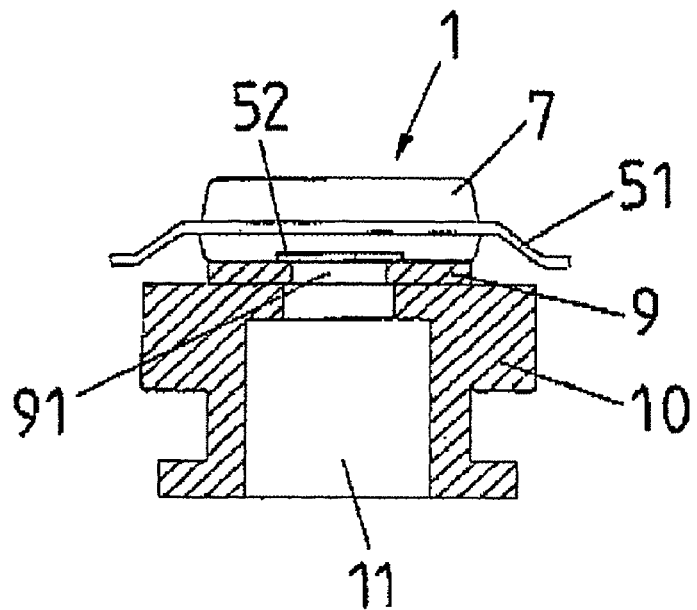
FIG. 3A shows a first exemplary embodiment of an optoelectronic arrangement with an optoelectronic component and a component connected to it, in a sectional view.

FIG. 1 schematically shows an optoelectronic component 1 with an optically transparent carrier substrate 2 (also referred to as a submount), an optoelectronic transducer device 3 arranged on the carrier substrate and a circuit 4 which is integrated in the carrier substrate and is electrically connected to the optoelectronic transducer device 3.

The optically transparent carrier substrate 2 is transparent at least for wavelengths which the transducer device 3 receives or transmits. Coupling of light signals takes place from the back side 22 of the carrier substrate through the carrier substrate to or from the front side 21, on which the transducer device 3 is located, cf. arrow A. Silicon is used for example as the carrier substrate for infrared light or sapphire is used as the carrier substrate for visible light. The materials referred to for the carrier substrate 4 additionally have the advantage that they provide good heat removal, which is advantageous in particular in the operation of a laser diode. Further possible materials for the optically transparent carrier substrate 4 are, for example, SiC, $Al_2O_3$, GaP and glass, depending on the wavelength of the light used.

The electrical circuit 4 is integrated in the carrier substrate. This takes place in a way known per se as part of a patterning process of the carrier substrate, which preferably takes place on a wafer with subsequent separation of the individual, patterned chips. A multiplicity of chips with identical electrical circuits are thereby created on the wafer. The electrical circuit 4 is a wiring element for the optoelectronic transducer device 3, in particular a driver device for a laser diode or, if the transducer device represents a photodiode, a preamplifier for the signal received by the photodiode.

Alternatively, it may be provided that the electrical circuit 4 is not fully integrated in the carrier substrate, but rather is configured using hybrid technology. In hybrid technology, electrical components are used both in the form of layers with electrical properties and by means of SMD components or bare semiconductor chips. This involves using the thick-film or thin-film technique, as appropriate.

The optoelectronic transducer device 3 is preferably a photodiode or a vertically emitting laser. Coupling in of light signals in this case takes place from the back side 22 of the transparent carrier substrate, that is to say the carrier substrate 4 represents an optical window for the light to be received or to be transmitted.

It may be provided that the component 3 is arranged on the carrier substrate 2 by flip-chip mounting; when it is formed as a photodiode, the received light signal impinges on the photodiode directly. In the case in which it is formed as a vertically emitting laser diode, the light is coupled into the carrier substrate directly.

There are many possible ways of coupling the light from the back side 22 of the carrier substrate into an assigned optical waveguide or coupling it out, or of guiding it to optical structures in some other way. Examples of this are described in DE 100 36 357 A1.

The carrier substrate 2 performs two tasks. On the one hand, it serves as a carrier of the integrated or hybrid electrical circuit 4. On the other hand, it serves as an optical window for the light transmitted or to be received.

The optical transducer component 3 is configured as a separate, prefabricated component, which is placed onto the carrier substrate 2. An electrical connection with the electrical circuit 4 takes place either by means of metallizations 60 on the surface of the carrier substrate and/or by means of bonding wires 61, as schematically represented in FIG. 1. It is in this case provided that the transducer device 3 is arranged as close as possible to the electrical circuit 4. This has the advantage that the electrical connections (bonding wires or metallizations) can be made very short, so that inductances occurring at high frequencies can be reduced and, accordingly, higher data rates can be realized by means of the laser diode or photodiode. In particular, in the case of a photodiode, significantly improved detection behavior is obtained as a result of the short paths to the preamplifier.

It is pointed out that the optoelectronic component described has the considerable advantage that only one connecting step by means of bonding wires 61 and or metallizations 16 is required between the transducer component 3 and the electrical circuit 4. If the electrical circuit were arranged in a separate chip, which is then likewise arranged on the carrier substrate 2, it would be required to provide additional connections between the carrier substrate and such a chip in a further connecting step. This would entail the disadvantage that undesired inductances would occur to a greater extent on account of the additional connections. The risk of failure of the component would also be greater, since separately produced chips with electrical circuits would have to be attached on the carrier substrate 2 and contacted.

The production of the component 1 takes place by the electrical circuit being patterned on the carrier substrate in the form of repeats, the transducer devices then being arranged and separation of the individual chips subsequently being performed. These chips are formed in such a way that they still have sufficient space for an optoelectronic transducer device to be additionally attached on the carrier substrate. For example, the individual chips have an edge length of 1 mm times 1.3 mm. The individual separation may also be performed before the transducer devices are attached.

An actual exemplary embodiment of the optoelectronic component 1 is represented in FIG. 2. The carrier substrate 4 is located on a metallic base plate 52 (die pad), which has a central light aperture 8 for coupling the light in or out. The electrical circuit 4 is connected by means of bonding wires 6 to a leadframe 51. The entire arrangement is cast in a generally optically nontransparent encapsulating compound 7, which provides a plastic package. The leadframe 51 and the base plate 52 are in this case partly cast into the plastic package 7.

Overall, the optoelectronic component 1 consequently has a hybrid construction, since the transducer device 3 is placed as a prefabricated device onto the carrier substrate with the integrated electrical circuit 4. The hybrid construction reduces the risk of failure, since the transducer device 3 and the electrical circuit 4 can be realized on their own without any restrictions. The dual use of the carrier substrate 2 as an optical window and a carrier of the electrical circuit 4 means that it is possible, as represented in FIG. 2, in particular for an arrangement with a photodiode and preamplification to be realized in a small housing.

FIG. 3A shows the attachment of a surface-mountable optoelectronic component 1 with a leadframe 51 and a plastic package 7 on a connector receptacle 10 for an optical connector. The optoelectronic component 1 is preferably the optoelectronic component described in FIGS. 1 and 2. In principle, however, other optoelectronic components which are arranged in a plastic package may also be provided.

Figure 3B:
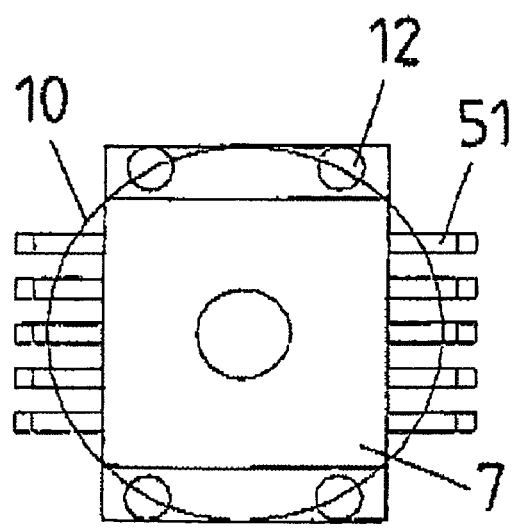
FIG. 3B shows a plan view of the arrangement of FIG. 3A.

FIGS. 3A to 8E concern the manner in which an optoelectronic component 1 is mechanically connected to a further component, which in FIGS. 3A, 3B is the connector receptacle 10. However, the further component may also be any other desired component to which the component 1 is to be attached. Apart from a connector receptacle, examples of such components are a coupling device, by means of which light can be coupled into an optical waveguide bidirectionally, a waveguide stub of a pigtail configuration, a heat sink and generally objects which have a surface area with an optical aperture or light-guiding regions.

In the exemplary embodiment of FIGS. 3A, 3B, an optical fiber is inserted in the aperture 11 of the connector receptacle 10, this fiber being optically coupled to a transducer device of the component 1. Connector receptacles of this type are known per se, so they are not discussed any further.

It is then provided, for the mechanical connection of the component 1 to the connector receptacle 10, to insert a separate, planar-formed mounting plate 9. This is connected on its one side to an outer surface of the plastic package 7 of the component 1 or to an outer base plate 52 (die pad) of the component 1, which together with the plastic package 7 forms an outer surface of the component 1. With its other side, the mounting plate 9 establishes a connection with the connector receptacle 10. This is consequently a kind of mechanical interface for the connection of the optoelectronic component 1 to a further component 10. In the center, the mounting plate 9 has a clearance 91 for light to pass through.

It is preferably provided in this respect that the mounting plate 9 is premounted on the optoelectronic component 1, the unit comprising the component 1 and the mounting plate 9 being fitted into an optical system by the system manufacturer.

The mounting plate 9 is preferably a metal plate, for example of a weldable steel. However, the use of a mounting plate of a polymer material or of mixed materials, such as ceramic for example, is likewise conceivable. The use of mixed materials is particularly advantageous for satisfying requirements of joining technology that are in themselves not compatible. For example, it may be advisable to solder the mounting plate with its one side to the component and to weld it with its other side to a connector receptacle. To satisfy these requirements, for example, one side of a solderable material is coated with a weldable material, or vice versa. This may be performed for example by means of what is known as the MIM (Metal Inject Molding) technique, a metal being injection-molded and then connected to a material with different surface properties.

The mechanical connection of the mounting plate 9 to the plastic package 7 preferably takes place by means of soldering, welding and/or adhesive bonding, depending on the material of the mounting plate and the thermal and mechanical requirements. The joining of the mounting plate 9 to the plastic package 7 is a simple process with moderate accuracy requirements.

Laser welding is used with preference as the joining technique for connecting the mounting plate 9 to the receptacle 10 or some other component, if a durable coupling capable of single-mode operation is intended. FIG. 3B shows the welding points 12 of such laser welding. The welding points 12 are in this case located at the edge of the connector receptacle 10. This involves providing small holes 12 in which the materials can fuse with one another.

Couplings capable of multimode operation may be realized for example by soldering, adhesive bonding, welding, etc. between the underside of the mounting plate 9 and the connector receptacle 10.

In an advantageous way, the mounting plate 9 can be produced very easily and at low cost in various thicknesses.

This also makes it possible to compensate for varying focal lengths of the optoelectronic transducer component.

An alternative exemplary embodiment for the formation of the mounting plate is represented in FIGS. 8A to 8E.

According to this, it is provided that the mounting plate is formed by the base plate 20 (die pad) of the component 1, which, in the same way as in FIGS. 3A, 3B, is formed as a surface-mountable component with a leadframe 51. The base plate 20 may in this case be part of a cup-shaped leadframe. It is enlarged to the extent that it reaches as far as the chip 1 on at least one outer edge of the latter. It preferably even reaches beyond the outer edge, so that during the mechanical connection to a further component 10 no thermal loads of a transducer device of the component 1 arranged on the base plate 20 occur. Two regions 201, 202 that extend beyond the edge are provided in FIGS. 8A–8E. A central hole 203 makes it possible for light to pass through.

If it is formed from metal, the mounting element 9, 20 represents a good heat sink for the optoelectronic devices of the component 1. This applies in particular to the exemplary embodiment of FIGS. 8A–8E, that is to say if the base plate of the component is arranged such that it lies on the outside (known as an "exposed die pad") and reaches at least as far as the outer edges of the component. However, the mounting element 9 also serves as a heat sink in the case of the exemplary embodiment of FIGS. 3A, 3B, it being important for this purpose that it lies at least partly against the base plate 52 (made smaller in comparison with FIGS. 8A–8E).

The formation of the mounting element as a base plate according to FIGS. 8A–8E additionally has several advantages. On the one hand, a reduced heat transmission resistance is provided by a base plate that is enlarged at least as far as the edge of the component. On the other hand, there is no need for the working step of mechanically connecting the mounting element to the plastic package. The mounting element is already arranged adjacent to the plastic package during the production of the component 1. This takes place automatically during the encapsulation of the component with a plastic, which then forms the package. Consequently, the base plate can be welded, adhesively bonded, etc. directly to a suitable surface of a further component.

Figure 4A:
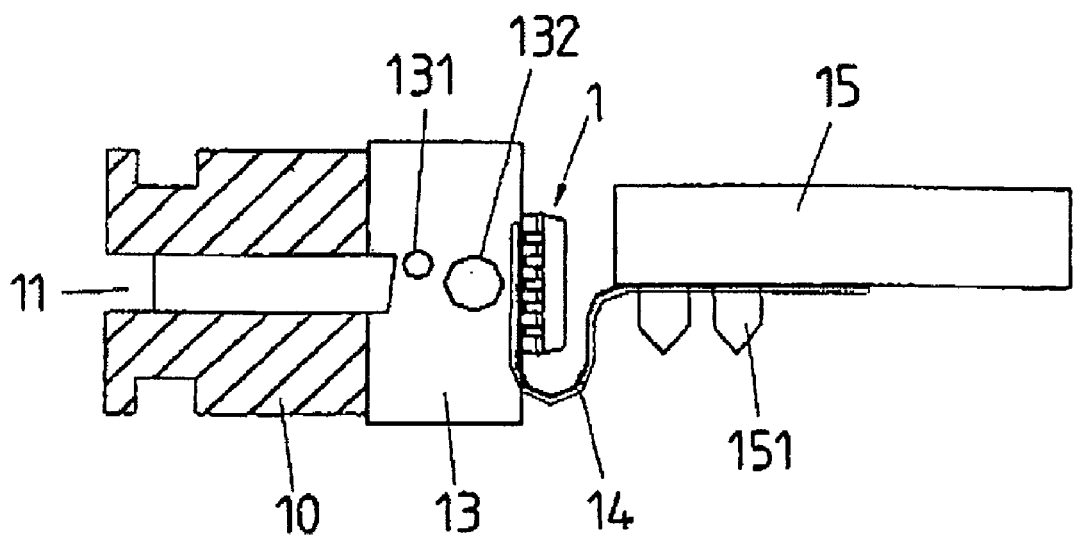
FIG. 4A shows a second exemplary embodiment of an arrangement with an optoelectronic component and a component connected to it, in a sectional view, the optoelectronic component being contacted by a flexboard.
Figure 4B:
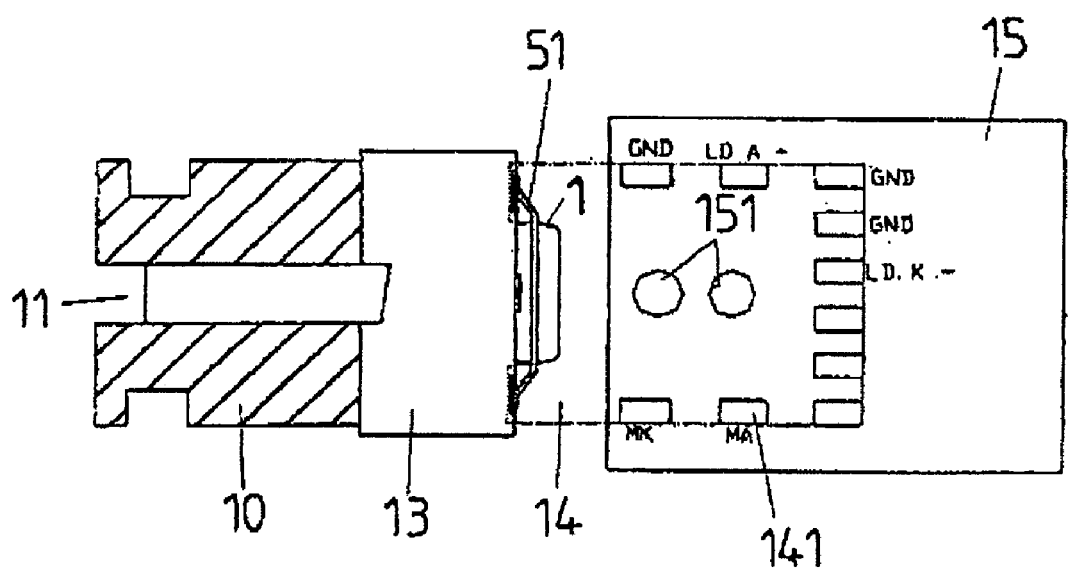
FIG. 4B shows the arrangement of FIG. 4A in a section turned by 90°.

FIGS. 4A, 4B show an exemplary embodiment of the electrical contacting of the arrangement of FIGS. 3A, 3B. Provided for this purpose is a flexboard 14 with contact regions, onto which the contact leads of the leadframe 51 of the component 1 are placed. The flexboard is therefore arranged under the contact leads 51. The other end of the flexboard is attached on a printed circuit board 15, adjusting posts 151 being provided for the mutual adjustment. Contact pads 141 of the flexboard are in electrical contact with corresponding contact pads of the printed circuit board 15. In this way, electrical signals are applied to the contact leads 51 of the component 1.

For better overall clarity, the metal plate is not separately represented in FIGS. 4A, 4B. To this extent, the construction is the same as in FIGS. 3A, 3B. As a departure from the configuration of FIGS. 3A, 3B, the connector receptacle 10 also has a spacing element 13, in which light-shaping regions 131, 132 are formed, shaping the light between the optoelectronic component 1 and an optical waveguide inserted into the aperture 11 of the connector receptacle 10. Such light-shaping elements 131, 132 are optional. Varying focal lengths of the optoelectronic component 1 can be compensated by means of the thickness of the spacing element 13. If appropriate, this may also take place by suitable choice of the thickness of the metal plate 9 (cf. FIG. 3A).

Figure 5A:
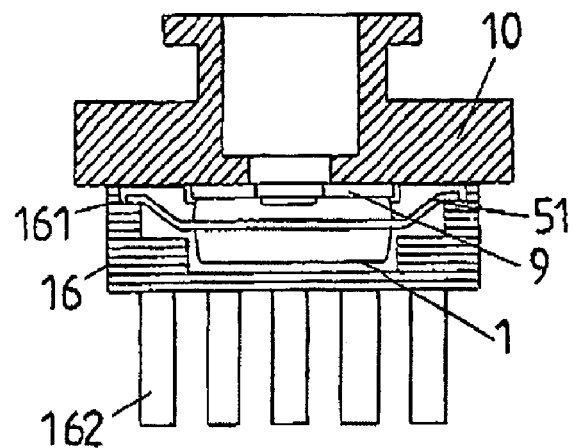
FIG. 5A shows a third exemplary element of another optoelectronic arrangement with an optoelectronic component and a component connected to it, in a sectional view, the latter component being arranged in a surrounding housing.
Figure 5B:
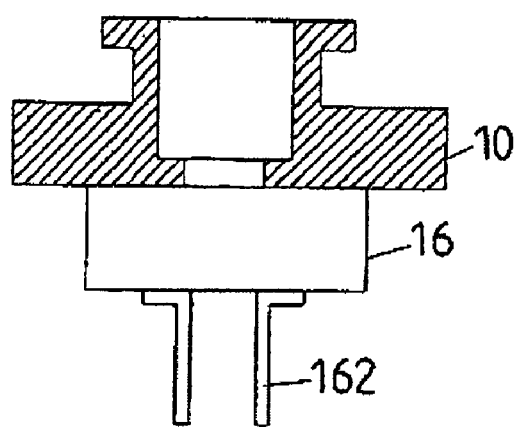
FIG. 5B shows the arrangement of FIG. 5A in a section turned by 90°.
Figure 5C:
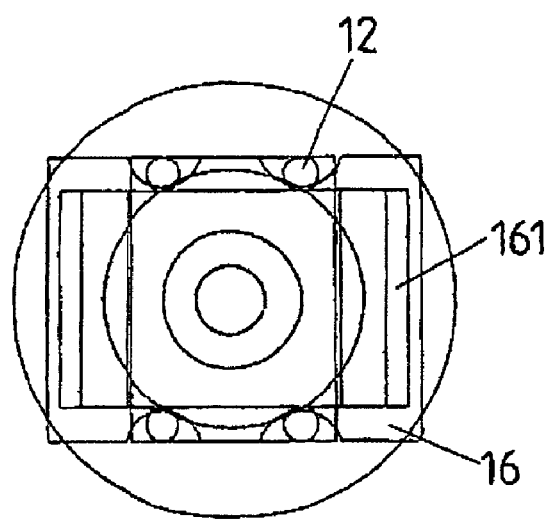
FIG. 5C shows a plan view of the arrangement of FIGS. 5A, 5B.

In the case of the exemplary embodiment of FIGS. 5A, 5B, 5C, electrical contacting of the optoelectronic component 1 takes place by means of a surrounding housing 16, which is placed on the component 1. The surrounding housing 16 is, for example, a ceramic housing or a printed circuit board with milled recesses. The surrounding housing 16 has steps 161, on which the contact leads of the leadframe 51 of the component 1 come to bear with their side facing away from the connector receptacle 10. In the corresponding regions, the steps 161 have contacting connections (not represented) and electrical paths, by means of which the corresponding signals are passed to the underside of the surrounding housing 16 and supplied to contact angles 152 arranged there. The contact angles 162 are connected for example to a further printed circuit board, which runs perpendicularly in relation to the surrounding housing 16, i.e. in the direction of the optical axis of the component 1.

As already mentioned, the steps 161 are produced for example by milling a printed circuit board. They are clearly illustrated in the plan view of FIG. 5C. Likewise represented in FIG. 5C are the welding points 12, by means of which the connection of the metal element 9 to an adjacent component 10 takes place, as explained with reference to FIG. 3B.

Figure 6:
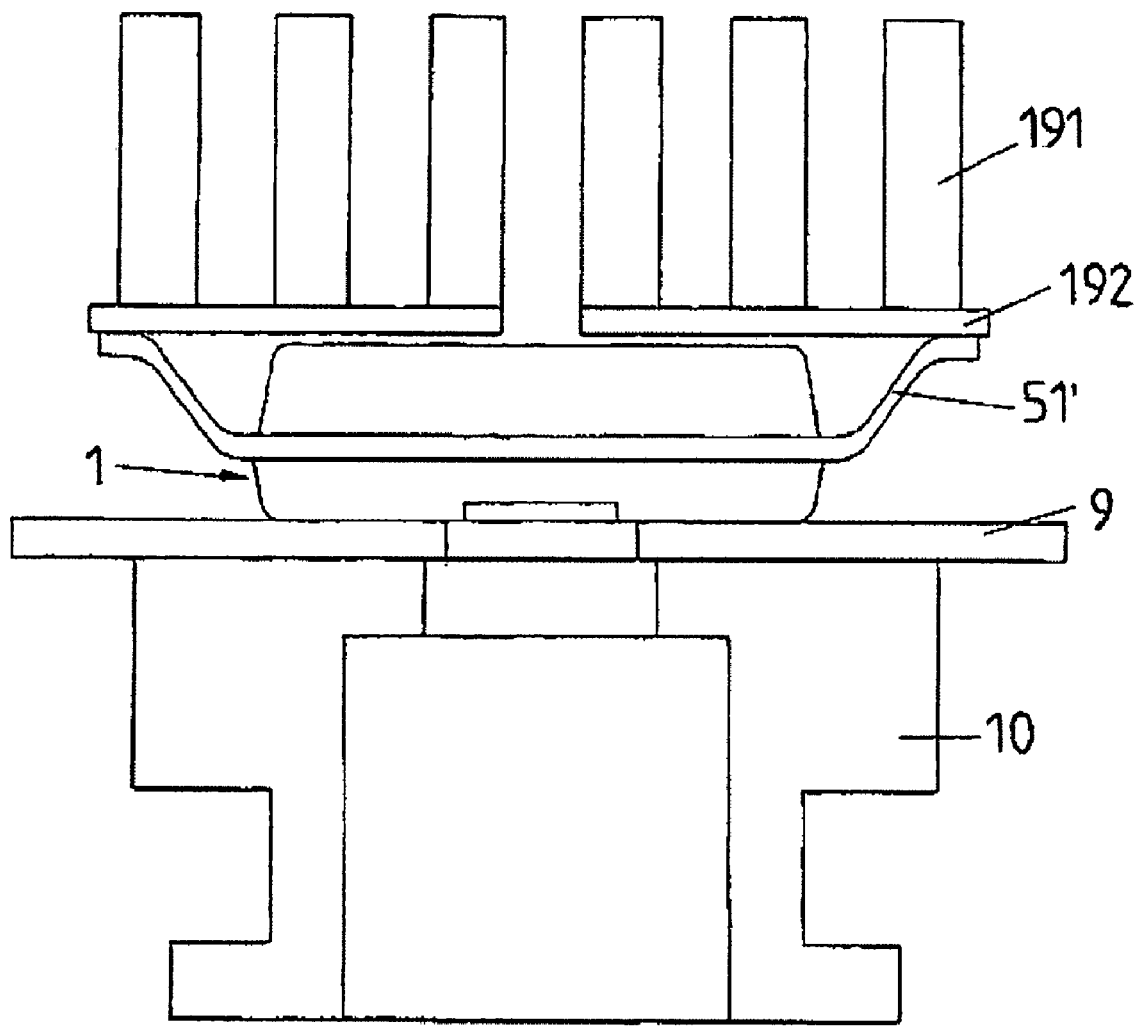
FIG. 6 shows a fourth exemplary embodiment of an optoelectronic arrangement with an optoelectronic component and a component connected to it, in a sectional view.
Figure 8B:
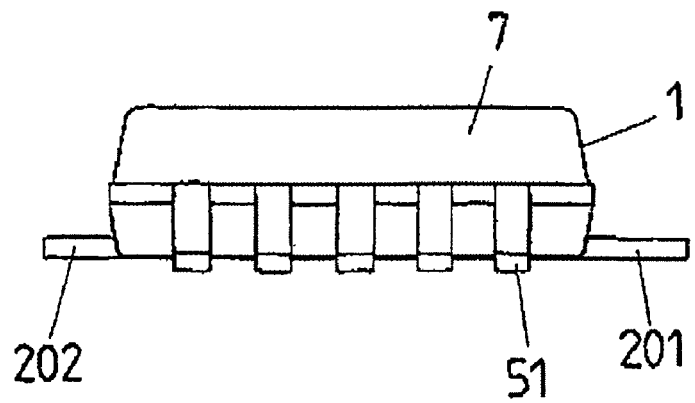
FIG. 8B shows the exemplary embodiment of FIG. 8A in a first side view.
Figure 8A:
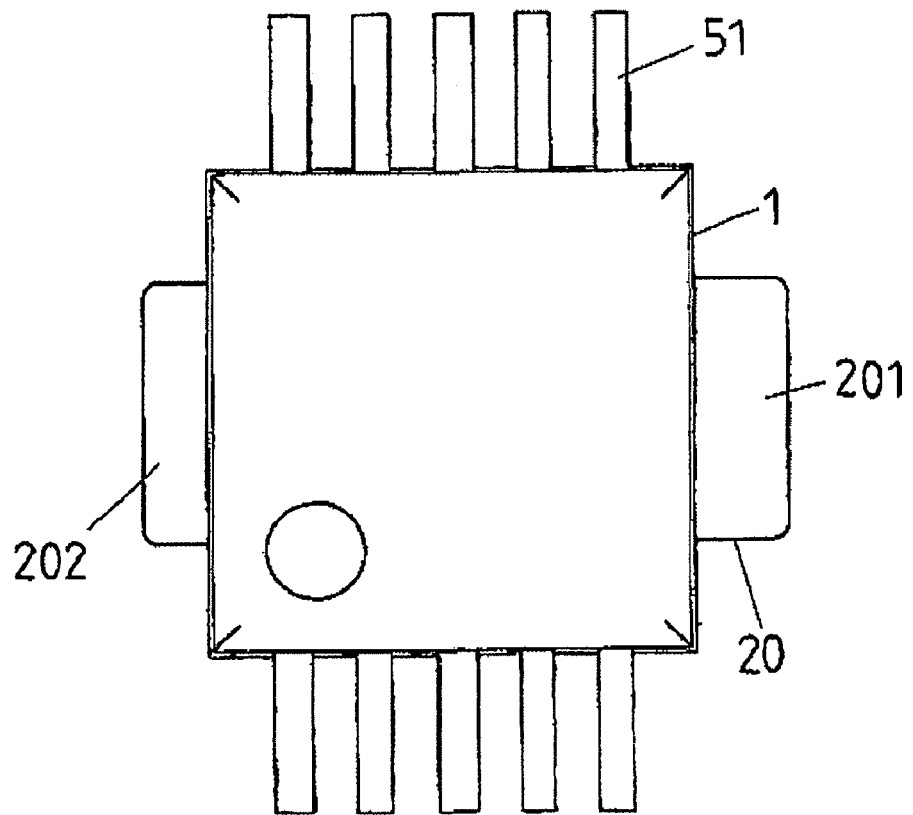
FIG. 8A shows an exemplary embodiment of an arrangement with an optoelectronic component and a base plate in plan view.
Figure 8C:
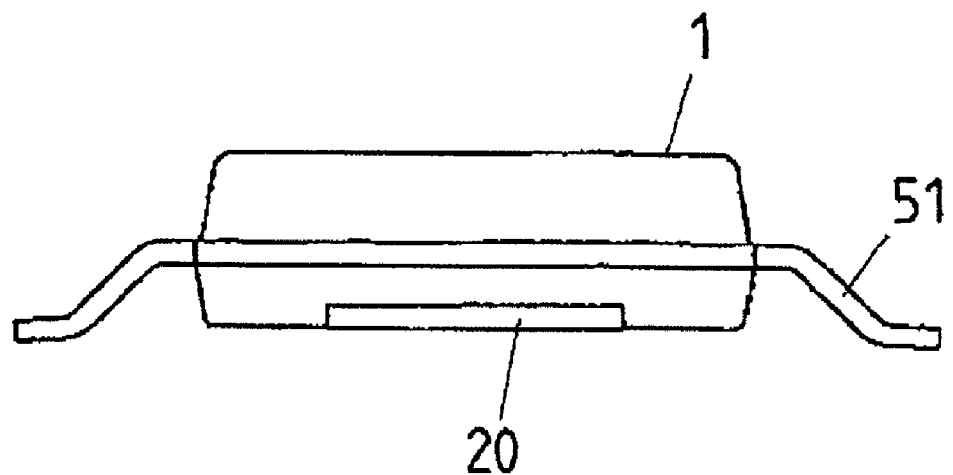
FIG. 8C shows the exemplary embodiment of FIG. 8A in a second side view.
Figure 8D:
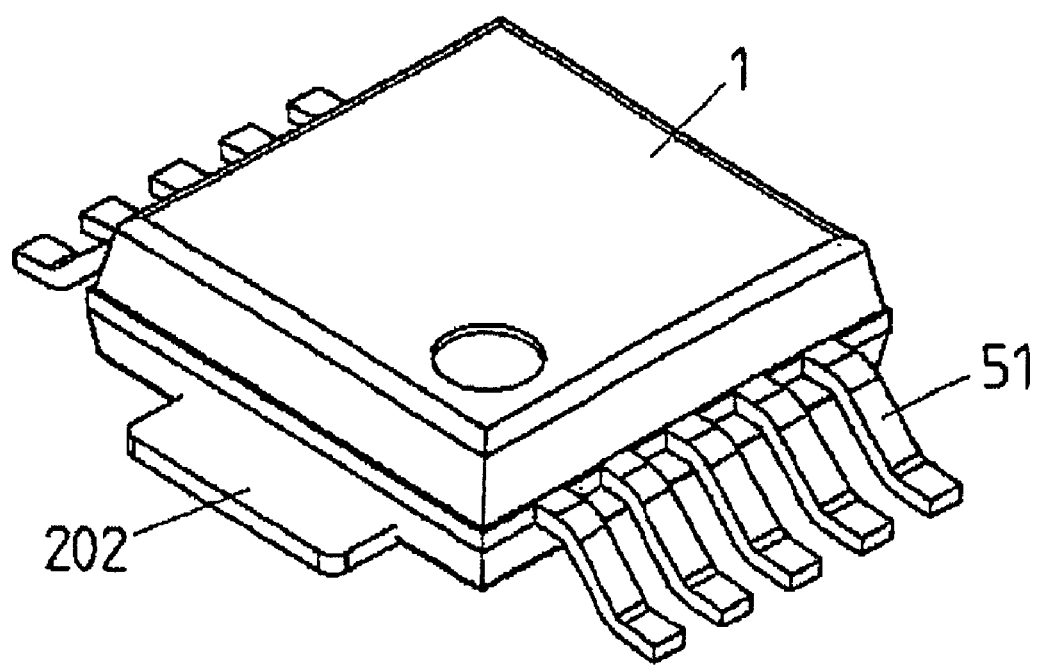
FIG. 8D shows an exemplary embodiment of FIG. 8A in a perspective view from above.
Figure 8E:
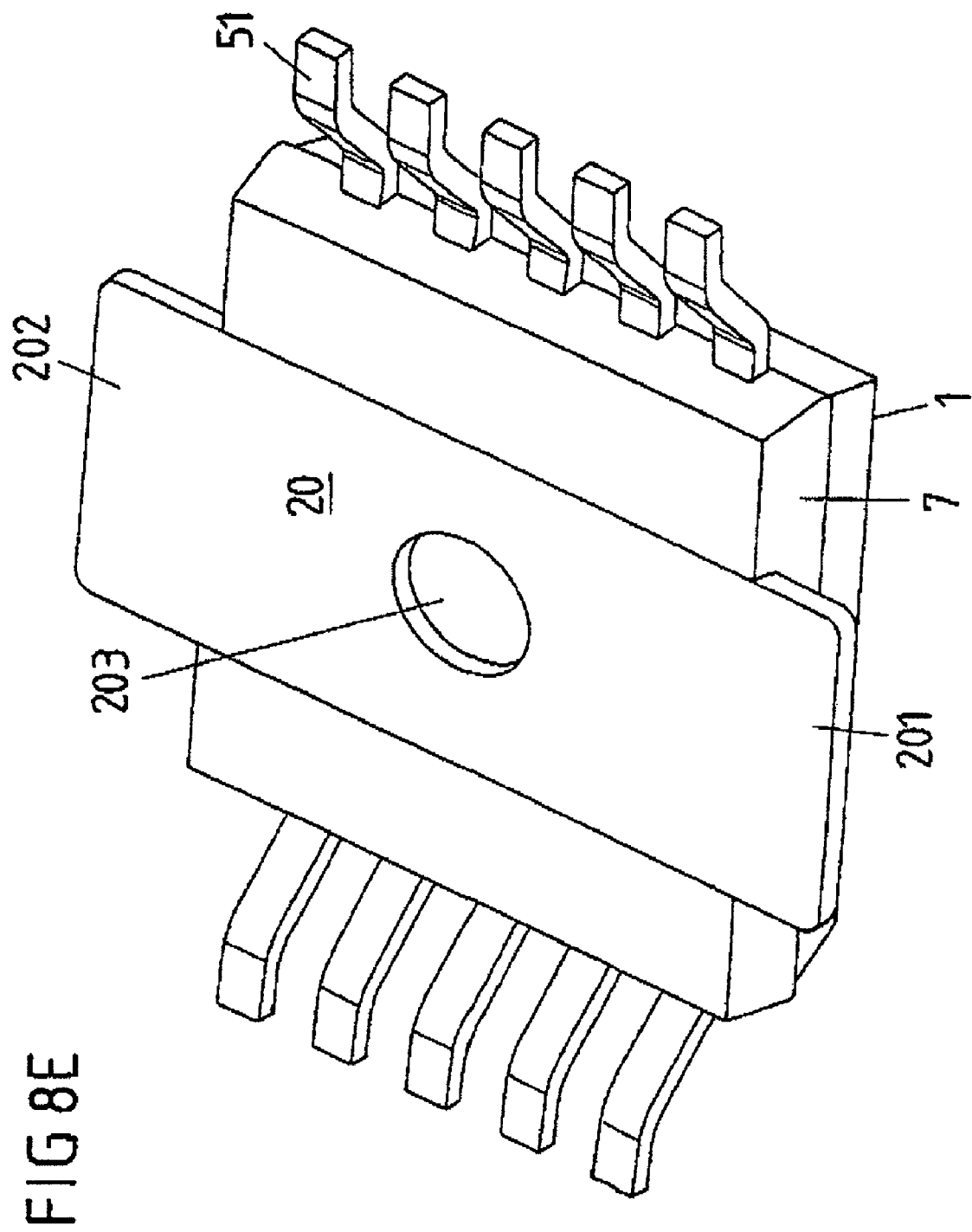
FIG. 8E shows an exemplary embodiment of FIG. 8A in a perspective view from below.

In the case of the exemplary embodiment of FIG. 6, a metal plate 9, which is connected on the one hand to the optoelectronic component 1 and on the other hand to a connector receptacle 10, is in turn provided. Unlike in the case of the previous exemplary embodiment, however, the contact leads of the leadframe 51' of the component 1 are not bent in the direction of the metal plate 9, but away from it.

What is known as a Krone leadframe, which is represented in FIGS. 7A, 7B, is provided for the contacting of the contact leads of the leadframe 51'. The Krone leadframe comprises a rectangular gripping region 17 and contact fingers 19 attached to the latter. The individual contact fingers respectively have a region 191 running perpendicularly in relation to the edge of the gripping region 17 and a region 192 running transversely thereto. The Krone leadframe is etched or punched from a metal plate. The leadframe 17 is then bent about the line 18 by 90°. This is represented in FIG. 7B.

The regions 192 of the Krone leadframe that are in the plane of the drawing of FIG. 7B respectively come into contact with a contact lead of the leadframe 51' of the component 1, cf. FIG. 6. The regions 191 angled away perpendicularly thereto protrude perpendicularly thereto. Once mounting has taken place, the gripping region 17 is removed by snapping it off.

We claim:

1. An optoelectronic component comprising:
   an optoelectronic transducer device for performing at least one of receiving light signals having specific wavelengths and transmitting light signals having specific wavelengths,
   an electrical circuit electrically connected to the transducer device, and
   a carrier substrate which is optically transparent to said light signals having specific wavelengths, the carrier substrate having a front side and a back side,
   wherein the transducer device is mounted on the front side of the carrier substrate and arranged to receive/transmit said light signals substantially perpendicularly in relation to the front side and the back side through the carrier substrate, wherein the electrical circuit is monolithically integrated into the carrier substrate, and wherein terminal contacts electrically connecting the circuit to the transducer device are arranged on the front side of the carrier substrate.

2. The component according to claim 1, wherein the transparent carrier substrate consists of silicon or sapphire.

3. The component according to claim 1, wherein the electrical circuit is a driver circuit for an optoelectronic transmitting device of a preamplifier circuit for an optoelectronic receiving device.

4. The component according to claim 1, wherein the optoelectronic transducer device is directly connected to the associated terminal contacts of the electrical circuit by bonding wires and/or metallizations on the front side of the carrier substrate.

5. The component according to claim 4, wherein the transducer device is mounted on the carrier substrate by flip-chip mounting.

6. The component according to claim 1, wherein the component is an electronic chip on which the optoelectronic transducer device is mounted alongside the electrical circuit.

7. An optoelectronic arrangement comprising:
an optoelectronic component which is arranged in a plastic package, and
an at least partly planar-formed mounting element which is one of (a) connected by a first side thereof to an outer side of the optoelectronic component, and (b) is integrated in the optoelectronic component and extends at least as far as an outer edge of the component,
wherein the mounting element includes on a second side thereof a mechanical interface for the mechanical connection of the optoelectronic component to a further component.

8. The arrangement according to claim 7, wherein the mounting element represents a part which is separate from the optoelectronic component and is joined to at least one of the plastic package of the component and an outer base plate of the component.

9. The arrangement according to claim 8, wherein the mounting element is a mounting plate which consists in particular of at least one of a metal, a polymer, and mixed materials with different surface properties.

10. The arrangement according to claim 7, wherein the mounting element is formed by an enlarged base plate of the component, which serves as a carrier of at least one component part of the optoelectronic component, the base plate extending at least as far as an outer edge of the component.

11. The arrangement according to claim 10, wherein the base plate is formed by the bottom region of a leadframe formed in a cup-shaped manner.

12. The arrangement according to claim 7, wherein the mounting element additionally serves as a heat sink of the optoelectronic component.

13. The arrangement according to claim 7, wherein the mounting element is connected to the plastic package by soldering, welding or adhesive bonding.

14. The arrangement according to claim 7, wherein the mounting element has at least one aperture for optical radiation to pass through.

15. The arrangement according to claim 7, wherein the optoelectronic component is surface-mountable.

16. The arrangement according to claim 7, wherein the arrangement additionally has a further component, which is mechanically connected to the second side of the mounting element.

17. The arrangement according to claim 16, wherein the mounting element is mechanically connected to the further component by a laser welding technique.

18. The arrangement according to claim 7, wherein the component is arranged on its side facing away from the mounting element in a surrounding housing, whereby contacting of the electrical terminals of the component is provided.

19. The arrangement according to claim 18, wherein the surrounding housing forms steps, on which leadframe leads of a leadframe of the optoelectronic component rest.

20. The arrangement according to claim 7, wherein electrical contacting of the optoelectronic component takes place by a flexboard, which is connected to leadframe leads of a leadframe of the component.

21. The arrangement according to claim 7, wherein leadframe leads of a leadframe of the component are bent away from the mounting element and connected to contacts of a further leadframe.

22. The arrangement according to claim 7, wherein the at lest partly planar-formed mounting element provides for a mechanical interface only and does not provide for electrical contacting of the optoelectronic component.

* * * * *